United States Patent
Takatani et al.

(10) Patent No.: US 6,812,496 B2
(45) Date of Patent: Nov. 2, 2004

(54) GROUP III NITRIDE SEMICONDUCTOR LASER DEVICE

(75) Inventors: Kunihiro Takatani, Kashiba (JP); Shigetoshi Ito, Ikoma (JP); Takayuki Yuasa, Ikoma-Gun (JP); Mototaka Taneya, Nara (JP); Kensaku Motoki, Minoo (JP)

(73) Assignees: Sharp Kabushiki Kaisha, Osaka (JP); Sumitomo Electric Industries, Ltd., Itami (JP)

( * ) Notice: Subject to any disclaimer, the term of this patent is extended or adjusted under 35 U.S.C. 154(b) by 0 days.

(21) Appl. No.: 10/334,140

(22) Filed: Dec. 31, 2002

(65) Prior Publication Data

US 2003/0132441 A1 Jul. 17, 2003

(30) Foreign Application Priority Data

Jan. 10, 2002 (JP) .......................................... 2002-3004

(51) Int. Cl.[7] .............................................. H01L 27/15
(52) U.S. Cl. ............................ 257/79; 257/52; 257/49; 257/615; 438/22; 438/46; 438/604
(58) Field of Search .............................. 257/49, 52, 79, 257/615; 438/22, 46, 604

(56) References Cited

U.S. PATENT DOCUMENTS 4,612,072 A * 9/1986 Morrison et al. ............. 117/90
6,459,712 B2 * 10/2002 Tanaka et al. ................. 372/45
6,667,184 B2 12/2003 Motoki et al.
2001/0055324 A1 * 12/2001 Ota .............................. 372/43
2002/0168844 A1 * 11/2002 Kuramoto et al. .......... 438/604
2003/0145783 A1 8/2003 Motoki et al.

FOREIGN PATENT DOCUMENTS

| JP | 2003-133650 | * 5/2003 | .......... H01S/5/343 |
| WO | WO 03/034560 A1 | 4/2003 | |
| WO | WO 03/038957 A1 | 5/2003 | |

* cited by examiner

*Primary Examiner*—David Nelms
*Assistant Examiner*—Dao H. Nguyen

(57) ABSTRACT

A nitride semiconductor laser device using a group III nitride semiconductor also as a substrate offers excellent operation characteristics and a long laser oscillation life. In a layered structure of a group III nitride semiconductor formed on a GaN substrate, a laser optical waveguide region is formed elsewhere than right above a dislocation-concentrated region extending so as to vertically penetrate the substrate, and electrodes are formed on the top surface of the layered structure and on the bottom surface of the substrate elsewhere than right above or below the dislocation-concentrated region. In a portion of the top surface of the layered structure and in a portion of the bottom surface of the substrate right above and below the dislocation-concentrated region, dielectric layers may be formed to prevent the electrodes from making contact with those regions.

8 Claims, 15 Drawing Sheets

4

GROUP III NITRIDE SEMICONDUCTOR LASER DEVICE

BACKGROUND OF THE INVENTION

1. Field of the Invention

The present invention relates to a semiconductor laser device using a group III nitride semiconductor.

2. Description of the Prior Art

In general, group III nitride semiconductors of the formula $In_xGa_yAl_zN$ (where $0 \leq x \leq 1$, $0 \leq y \leq 1$, $0 \leq z \leq 1$, and $x+y+z=1$) have wide energy band gaps and high thermal stability, and their band gap widths can be controlled through the adjustment of their composition. For these reasons, their application is being developed in a variety of semiconductor devices such as light-emitting devices and high-temperature devices.

As light-emitting devices, light-emitting diodes (LEDs) that emit light having luminous intensity of the order of a few candelas in a wavelength range of blue to green have already been put to practical use, and laser diodes (LDs) are in the process of being developed for practical use. With respect to laser diodes, from the early stages of their development, the feasibility of using a comparatively easily available insulating substrate, such as sapphire, has been studied.

However, in a device using a sapphire substrate, crystal distortion resulting from a large lattice mismatch between the substrate and the epitaxial layer (about 14% between the sapphire C plane and the GaN crystal) and high-density dislocation defects ($10^8$ to $10^{10}$ $cm^{-2}$) introduced into the epitaxial layer have undesirable effects on the device's characteristics such as its working life. Moreover, where sapphire is used as the substrate of a semiconductor laser device, since the substrate and the epitaxial layer have different cleavage planes, it is difficult to obtain satisfactory end surfaces when the end surfaces of the optical resonant cavity are formed by a method relying on cleavage, a common way of forming them.

Attempts have been made to avoid these problems by using as the substrate a material other than sapphire, for example SiC or the like. This, however, does not fundamentally improve the problems associated with the size and availability of the substrate, lattice mismatch, etc.

From the viewpoint of resolving the lattice mismatch between the substrate and the epitaxial layer, reducing crystal defects, and obtaining a satisfactory crystal, the inventors of the present inventions have been developing devices using as their substrate GaN, which, like their epitaxial layer, is a group III nitride semiconductor.

As a result, it is now possible to greatly improve the characteristics of nitride semiconductor laser devices. However, the use of a GaN substrate does not always result in a satisfactory nitride semiconductor laser device. Specifically, it has been found out that, in some such devices, their operation current gradually increases, or their characteristics rapidly deteriorate. Through an intensive study in search of the causes, the inventors of the present invention have found out that there are several methods of producing a GaN substrate, each producing a substrate different in structure and quality, and that the resulting differences affect the layered structure formed on the substrate, greatly influencing the characteristics of a nitride semiconductor laser device.

SUMMARY OF THE INVENTION

An object of the present invention is to provide a nitride semiconductor laser device using a group III nitride semiconductor also as a substrate wherein the structure of the device is optimized to suit the substrate actually used in order to achieve excellent operation characteristics and a long laser oscillation life.

To achieve the above object, according to one aspect of the present invention, in a semiconductor laser device comprising a substrate of a group III nitride semiconductor, a layered structure of a group III nitride semiconductor formed on the top surface of the substrate, and an electrode formed on the top surface of the layered structure, the substrate has a dislocation-concentrated region extending from the bottom surface to the top surface thereof and a low-dislocation region constituting the remaining portion thereof other than the dislocation-concentrated region, the layered structure has a stripe-shaped laser optical waveguide region located right above the low-dislocation region of the substrate, and the electrode is located right above the low-dislocation region of the substrate.

This semiconductor laser device has a substrate of a group III nitride semiconductor, in which a dislocation-concentrated region extends so as to vertically penetrate it. However, a laser optical waveguide region included in a layered structure of a group III nitride semiconductor is located not above the dislocation-concentrated region but above a low-dislocation region, i.e. the portion of the substrate other than the dislocation-concentrated region. Thus, even if the dislocation-concentrated region influences the structured layer and causes defects in a portion thereof above the dislocation-concentrated region, the laser optical waveguide region, located away from those defects, offers satisfactory characteristics.

Moreover, an electrode formed on the top surface of the layered structure is also located not above the dislocation-concentrated region but above the low-dislocation region. Thus, even if the defects in the portion above the dislocation-concentrated region reach the top surface of the layered structure and are exposed, the electrode is located away from those defects. This prevents current from flowing through the dislocation-concentrated region of the substrate and through a possibly defect-ridden portion of the layered structure above it, and thus helps alleviate the deterioration of the laser optical waveguide region resulting from an increase in the operation current.

According to another aspect of the present invention, in a semiconductor laser device comprising a substrate of a group III nitride semiconductor, a layered structure of a group III nitride semiconductor formed on the top surface of the substrate, and an electrode formed on the bottom surface of the substrate, the substrate has a dislocation-concentrated region extending from the bottom surface to the top surface thereof and a low-dislocation region constituting the remaining portion thereof other than the dislocation-concentrated region, the layered structure has a stripe-shaped laser optical waveguide region located right above the low-dislocation region of the substrate, and the electrode is located right below the low-dislocation region of the substrate.

This semiconductor laser device, too, has a dislocation-concentrated region extending in a substrate so as to vertically penetrate it. However, a laser optical waveguide region is located not above the dislocation-concentrated region but above a low-dislocation region. Thus, even if defects arise in a portion of the layered structured above the dislocation-concentrated region, the laser optical waveguide region, located away from those defects, offers satisfactory characteristics. On the bottom surface of the substrate, the lower end of the dislocation-concentrated region is exposed.

However, since an electrode formed on the bottom surface of the substrate is located not below the dislocation-concentrated region but below the low-dislocation region, and is thus located away from where the dislocation-concentrated region is exposed. This prevents current from flowing through the dislocation-concentrated region, and thus helps alleviate the deterioration of the laser optical waveguide region resulting from an increase in the operation current.

According to still another aspect of the present invention, in a semiconductor laser device comprising a substrate of a group III nitride semiconductor and a layered structure of a group III nitride semiconductor formed on the top surface of the substrate, the substrate has a dislocation-concentrated region extending from the bottom surface to the top surface thereof and a low-dislocation region constituting the remaining portion thereof other than the dislocation-concentrated region, the layered structure has a stripe-shaped laser optical waveguide region located right above the low-dislocation region of the substrate, and current-shielding layers are formed, one in a portion of the bottom surface of the substrate located below the dislocation-concentrated region and another in a portion of the top surface of the layered structure located above the dislocation-concentrated region.

This semiconductor laser device, too, has a dislocation-concentrated region extending in a substrate so as to vertically penetrate it. However, a laser optical waveguide region is located not above the dislocation-concentrated region but above a low-dislocation region. Thus, even if defects arise in a portion of the layered structured above the dislocation-concentrated region, the laser optical waveguide region, located away from those defects, offers satisfactory characteristics. On the bottom surface of the substrate, the lower end of the dislocation-concentrated region is exposed. However, since a current-shielding layer is formed in this portion of the bottom surface of the substrate, even if part of an electrode formed on the bottom surface of the substrate is located in this portion, no current flows between the electrode and the dislocation-concentrated region.

Moreover, even if the defects arising above the dislocation-concentrated region reach the top surface of the layered structure and are exposed, since a current-shielding layer is formed in this portion of the top surface of the layered structure, even if part of an electrode formed on the top surface of the layered structure is located in this portion, no current flows between the electrode and the defect-ridden portion of the layered structure. This prevents current from flowing through the dislocation-concentrated region of the substrate and through a possibly defect-ridden portion of the layered structure, and thus helps alleviate the deterioration of the laser optical waveguide region resulting from an increase in the operation current.

According to a further aspect of the present invention, in a semiconductor laser device comprising a substrate of a group III nitride semiconductor and a layered structure of a group III nitride semiconductor formed on the top surface of the substrate, the substrate has a dislocation-concentrated region extending from the bottom surface to the top surface thereof and a low-dislocation region constituting the remaining portion thereof other than the dislocation-concentrated region, and the layered structure has a stripe-shaped laser optical waveguide region located right above the low-dislocation region of the substrate, and a current-shielding layer is formed inside the layered structure in a portion thereof located above the dislocation-concentrated region of the substrate.

This semiconductor laser device, too, has a dislocation-concentrated region extending in a substrate so as to vertically penetrate it. However, a laser optical waveguide region is located not above the dislocation-concentrated region but above a low-dislocation region. Thus, even if defects arise in a portion of the layered structured above the dislocation-concentrated region, the laser optical waveguide region, located away from those defects, offers satisfactory characteristics. Moreover, since a current-shielding layer is formed in a portion of the layered structured above the dislocation-concentrated region, even if defects arise in this portion, no current flows therethrough. This prevents current from flowing through the dislocation-concentrated region of the substrate and through a possibly defect-ridden portion of the layered structure, and thus helps alleviate the deterioration of the laser optical waveguide region resulting from an increase in the operation current.

The dislocation-concentrated region, as seen from above, may be shaped like a stripe substantially parallel to the laser optical waveguide region of the layered structure. Giving the dislocation-concentrated region such a shape makes it easy to form the laser optical waveguide region, and also makes it easy to form the electrodes and the current-shielding layer.

The current-shielding layer or current-shielding layers may be made of a dielectric containing at least one of $SiO_2$, SiN, SiO, ZnO, PbO, $TiO_2$, $ZrO_2$, $CeO_2$, $HfO_2$, $Al_2O_3$, $Bi_2O_3$, $Cr_2O_3$, $In_2O_3$, $Nd_2O_3$, $Sb_2O_3$, $Ta_2O_5$, $Y_2O_3$, $AlF_3$, $BaF_2$, $CeF_2$, $CaF_2$, $MgF_2$, $NdF_3$, $PbF_2$, $SrF_2$, ZnS, and ZnSe.

It is preferable that the current-shielding layer or current-shielding layers have a thickness equal to or greater than 1 nm and smaller than or equal to 1 $\mu$m. This helps shield current without fail, and helps prevent mechanical defects such as cracking and exfoliation.

It is preferable that the current-shielding layer or current-shielding layers have a width equal to or greater than 5 $\mu$m and smaller than or equal to 300 $\mu$m. This helps shield without fail the current that tends to flow through the dislocation-concentration region and through a possibly defect-ridden portion of the layered structure while preventing the current-shielding layer or current-shielding layers from hampering the flow of current to be fed to the laser optical waveguide region.

BRIEF DESCRIPTION OF THE DRAWINGS

This and other objects and features of the present invention will become clear from the following description, taken in conjunction with the preferred embodiments with reference to the accompanying drawings in which.

DESCRIPTION OF THE PREFERRED EMBODIMENTS

Prior to the descriptions of individual embodiments of the invention, the GaN substrate used in the semiconductor laser devices of those embodiments will be described with reference to FIGS. 14 to 17. It is to be noted that, in the present specification, a negative index indicating a crystal plane or direction is represented by its absolute value headed with a negative symbol "−" instead of overscoring the figure as conventionally practiced in crystallography, because it is impossible to do so herein.

Figure 14:
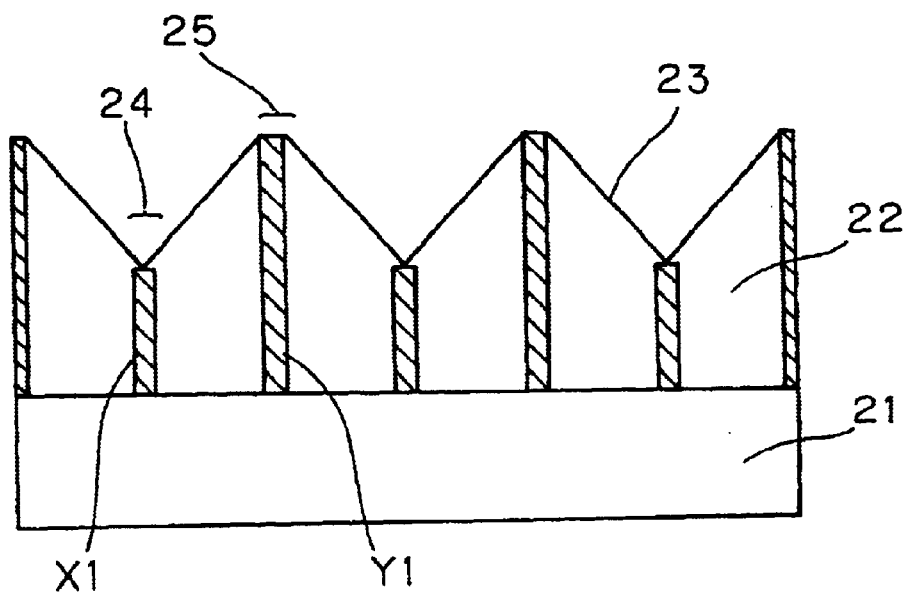
FIG. 14 is a vertical sectional view schematically showing, with enlargement, a portion of the GaN substrate in the middle of its fabrication.
Figure 15:
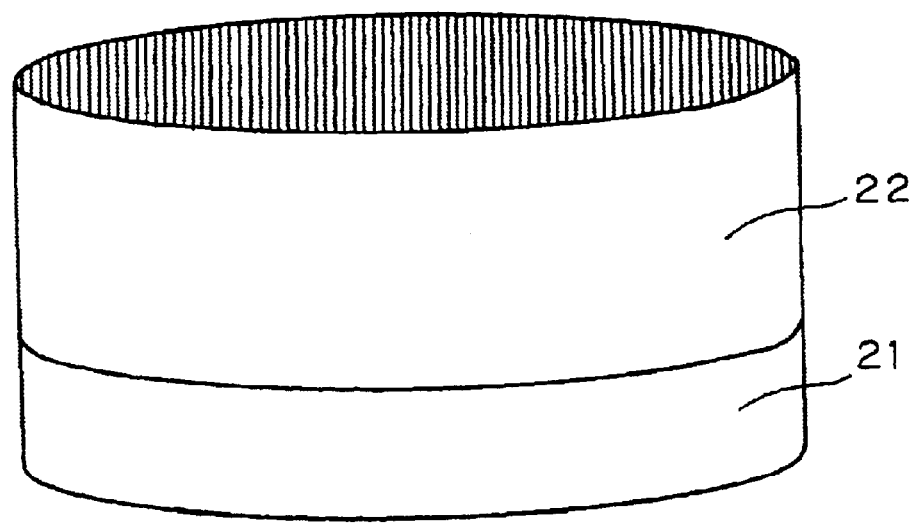
FIG. 15 is a perspective view schematically showing the GaN substrate in its entirety in the middle of its fabrication.

FIG. 14 is a vertical sectional view schematically showing, with enlargement, a portion of the GaN substrate in the middle of its fabrication, and FIG. 15 is a perspective view schematically showing the GaN substrate in its entirety. First, a mask having a pattern of periodically arranged stripes was laid on the surface of a suitable wafer to prepare a support base 21. Here, used as the wafer was a 2-inch GaAs wafer having its surface aligned with the (111) plane, and used as the mask was $SiO_2$. Next, by HVPE (hydride vapor phase epitaxy), an n-type GaN layer 22 was grown in the [0001] direction in such a way that the {11–22} facet 23 mainly appeared on the surface being grown. As a result, as shown in FIG. 14, the surface, with grooves and ridges formed thereon, came to have a sawtooth-shaped section. At the ridges appeared the {0001} plane 25 in the shape of stripes.

The grooves and ridges mentioned above extend in the direction of the depth of FIG. 14, and their pitch is determined by the pattern of the $SiO_2$ mask formed on the support base 21 in the beginning. That is, the $SiO_2$ mask lies right below the grooves, and the lines along the ridges, when projected on the support base 21, run substantially along the center lines of the openings in the $SiO_2$ mask. Here, the $SiO_2$ mask had a periodic pattern with a pitch of 400 μm, and therefore the grooves and ridges had an equal pitch, i.e. about 400 μm. The openings of the mask was substantially parallel to the [1–100] direction of the n-type GaN layer 22.

In this example, the $SiO_2$ mask is stripe-shaped, and accordingly the surface of the n-type GaN layer 22 comes to have grooves and ridges thereon. However, the mask may have, instead of a pattern of stripes, a pattern of dots. In that case, the surface of the n-type GaN layer 22 comes to have an array of bowl-shaped dents with their bottoms located right above where the mask lies, and the {11–22} facet appears at the slopes of the bowls. A method for maintaining the growth of a crystal with the {11–22} facet appearing on the surface (i.e. the conditions under which such growth is possible) is disclosed in detail in Japanese Patent Application Filed No. H11-273882, a prior application by the inventors of the present invention. Here, while the crystal was grown, it was doped with oxygen so that the grown crystal had n-type conductivity.

The growth of the n-type GaN layer 22 was continued, still in the growth mode that produced grooves and ridges on the surface as described above, until a 30 mm high ingot was produced on the support base 21 as shown in FIG. 15. In FIG. 15, the densely drawn lines on the top surface of the ingot schematically represent the surface ridges.

Figure 16:
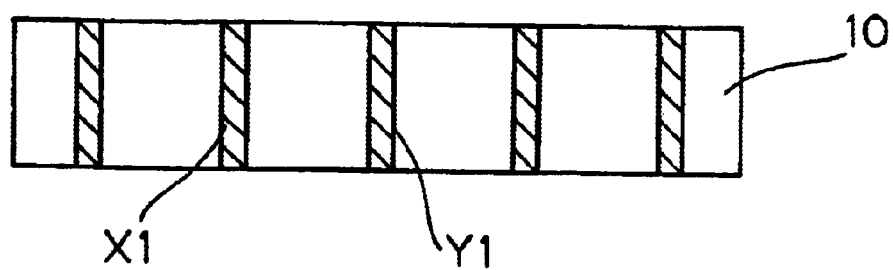
FIG. 16 is a vertical sectional view showing a portion of the GaN substrate.
Figure 17:
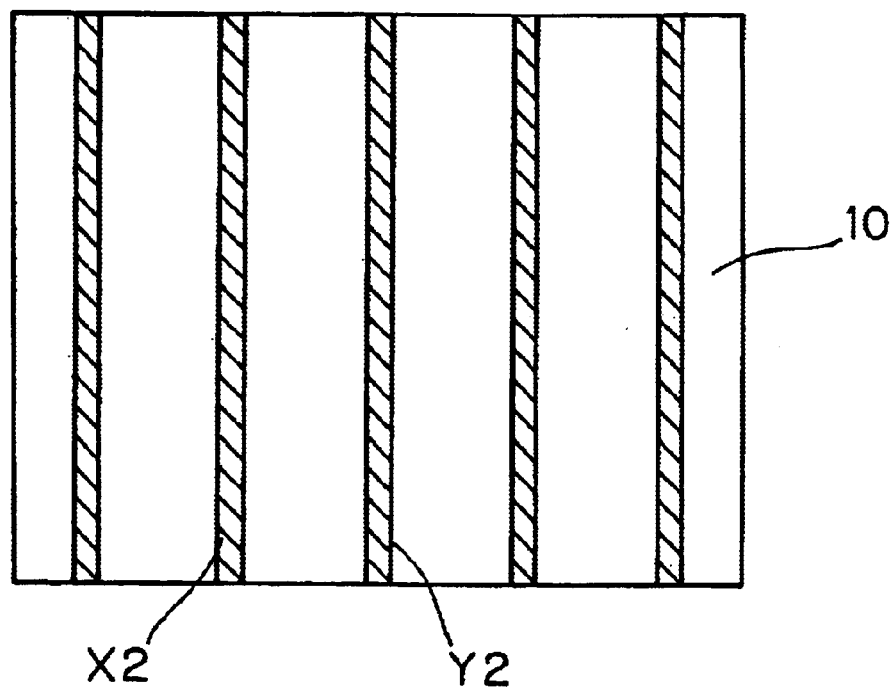
FIG. 17 is a top view showing a portion of the GaN substrate.

The ingot was then cut into thin slices with a slicer, and each thin slice was then ground to produce an n-type GaN substrate 10, which was a flat-surfaced wafer 2 inch (about 5 cm) across and 350 μm thick. The surface of the wafer was ground to a mirror surface to permit epitaxial growth in a later process. This surface was substantially aligned with the (0001) plane. More precisely, however, a comparison of the morphology of the nitride semiconductor layer epitaxially grown on the surface has shown that it is preferable that the surface be deviated by an angle of 0.2° to 1° from the (0001) plane in an arbitrary direction, an angle of 0.4° to 0.8° resulting in the best morphology. FIGS. 16 and 17 are a vertical sectional view and a top view, respectively, of a portion of the n-type GaN substrate 10 thus produced.

Next, the n-type GaN substrate 10 was evaluated. First, the surface of the substrate was inspected closely under an optical microscope. The ground surface was not perfectly flat, with slight depressions left in a stripe-shaped region corresponding to where the bottoms 24 (see FIG. 14) of the grooves lied when the n-type GaN layer 22 was grown. This region is indicated as X2 in FIG. 17.

Then, the surface of the n-type GaN substrate 10 was treated with a mixture of sulfuric acid and phosphoric acid to observe etch pits that appeared as a result. In the aforementioned stripe-shaped region corresponding to the grooves, many etch pits were observed, attesting to concentration of dislocations (defects) in the region. A portion of the substrate where dislocations concentrate is mechanically weaker than the other portion thereof, and is therefore susceptible to damage in the grounding process. This is considered to have produced depressions on the surface of the substrate.

The stripe-shaped region where dislocations concentrated had a width of about 5 to 40 μm, and, in this region, the density of etch pits was extremely high, specifically $10^5$ to $10^9/cm^2$. On the other hand, elsewhere than in this stripe-shaped region, the density of etch pits was low, specifically $10^2$ to $10^5/cm^2$. As these results show, in the portion X1 in FIGS. 14 and 16, the dislocation density is higher than outside it. In the present specification, this portion is called the "dislocation-concentrated region." The portion X2 in FIG. 17 is where the dislocation-concentrated region X1 is exposed on the surface.

Then, the n-type GaN substrate 10 was irradiated with ultraviolet radiation to observe fluorescence from the surface under a microscope (fluorescence microscope inspection). As a result, along the center line of the region sandwiched between two adjacent dislocation-concentrated regions X1, a stripe-shaped portion was observed that had comparatively clear borders and had different contrast than elsewhere. This light-emitting portion, with more intense fluorescence than outside it, appeared somewhat yellowish and bright. This portion corresponds to the portion 25 (FIG. 14) that grew with the {0001} plane appearing on the surface when the n-type GaN layer 22 was grown, and is indicated as Y2 in FIG. 17.

The width of this portion slightly varied from place to place, the maximum width observed being about 30 μm. The reason for this variation is considered to be that, when the crystal of the n-type GaN layer 22 grew, all the ridges 25 did not grow uniformly. The reason that fluorescence was observed differently than elsewhere is believed to be, among other reasons, that the dopant was absorbed differently between inside and outside the portion.

This portion where fluorescence is observed differently may be almost absent depending on the conditions under which the ingot is fabricated and where the wafer is located in the ingot before being cut out of it (i.e. the distance from the support base 21). On the basis of these facts, in the present specification, the portion Y2 is referred to as the "high-luminescence region." The high-luminescence region corresponds to the portion Y1 in FIGS. 14 and 16, which are sectional views of the n-type GaN substrate 10.

The semiconductor laser devices of individual embodiments of the invention described hereinafter are all composed of a layered structured of a group III nitride semiconductor formed on an n-type GaN substrate having dislocation-concentrated regions X1 and high-luminescence regions Y1 as described above. In these semiconductor laser devices, special attention was paid to the presence of the dislocation-concentrated region X1. In all the embodiments, a substrate produced by using an $SiO_2$ mask having a pattern of periodically arranged stripes with a pitch of 400 μm was used. Accordingly, the dislocation-concentrated regions X1 lay with a pitch of 400 μm, and so did the high-luminescence regions Y1.

First Embodiment

Figure 1:
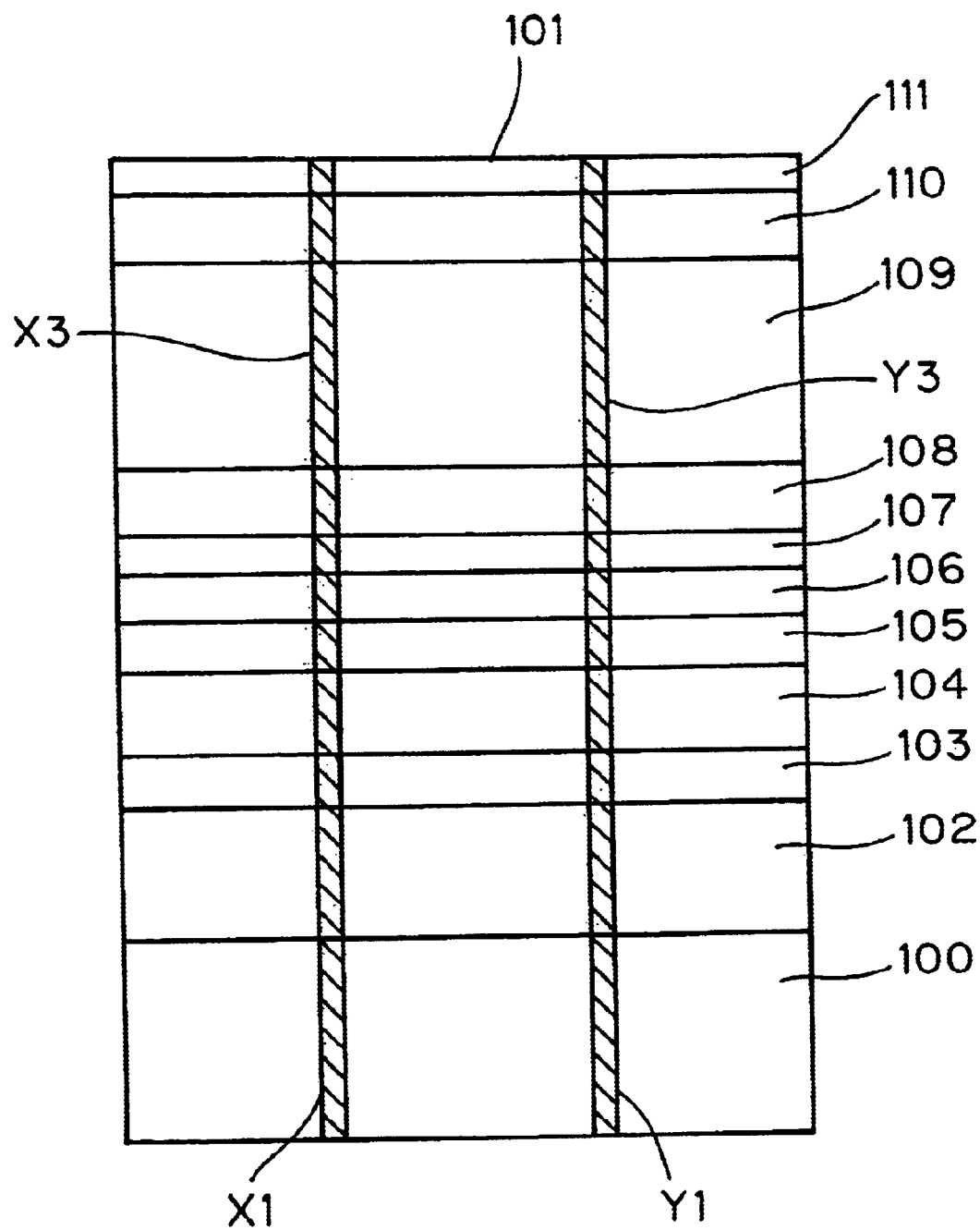
FIG. 1 is a vertical sectional view schematically showing the layer structure of the semiconductor laser device of a first embodiment, as observed in the middle of its fabrication.
Figure 2:
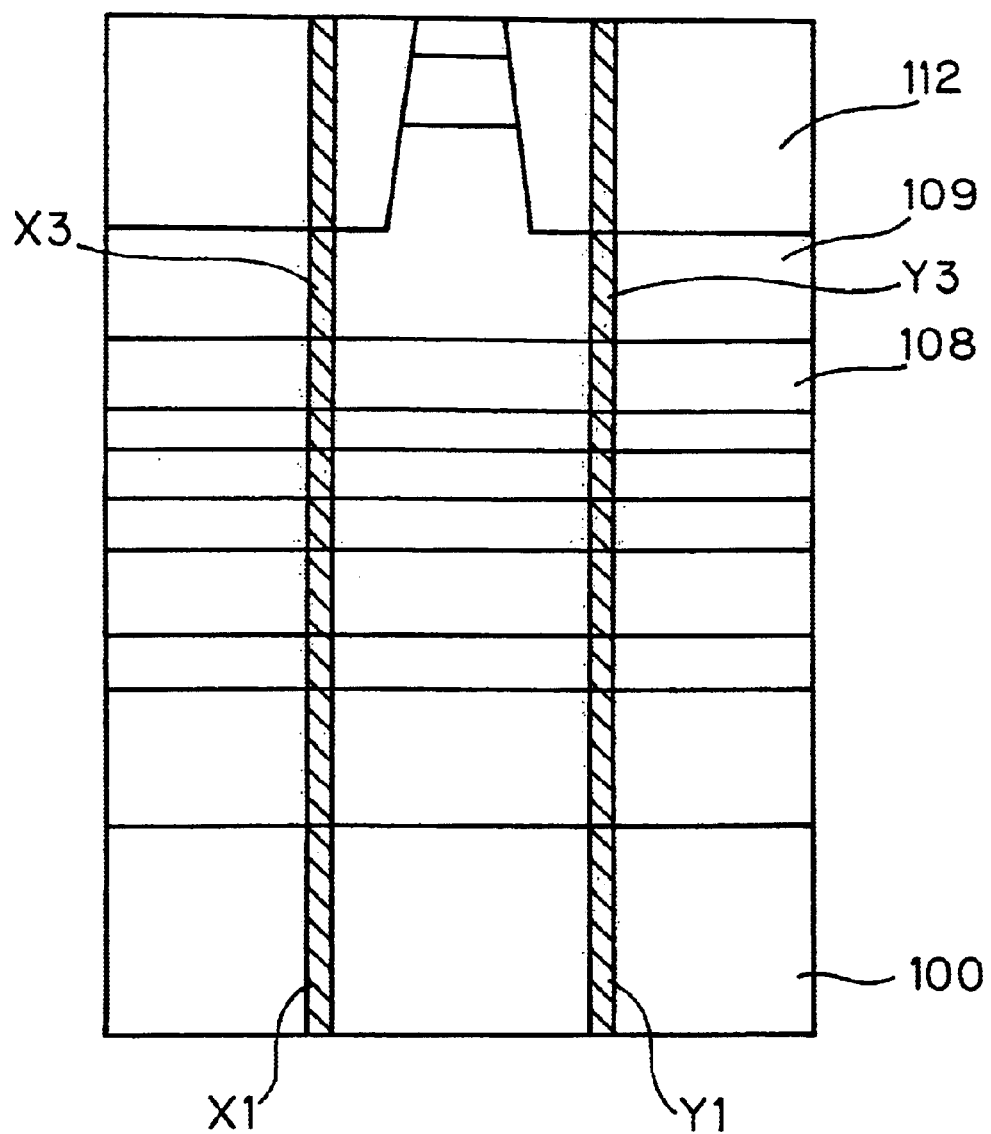
FIG. 2 is a vertical sectional view schematically showing the layer structure of the semiconductor laser device of the first embodiment, as observed in the middle of its fabrication.
Figure 3:
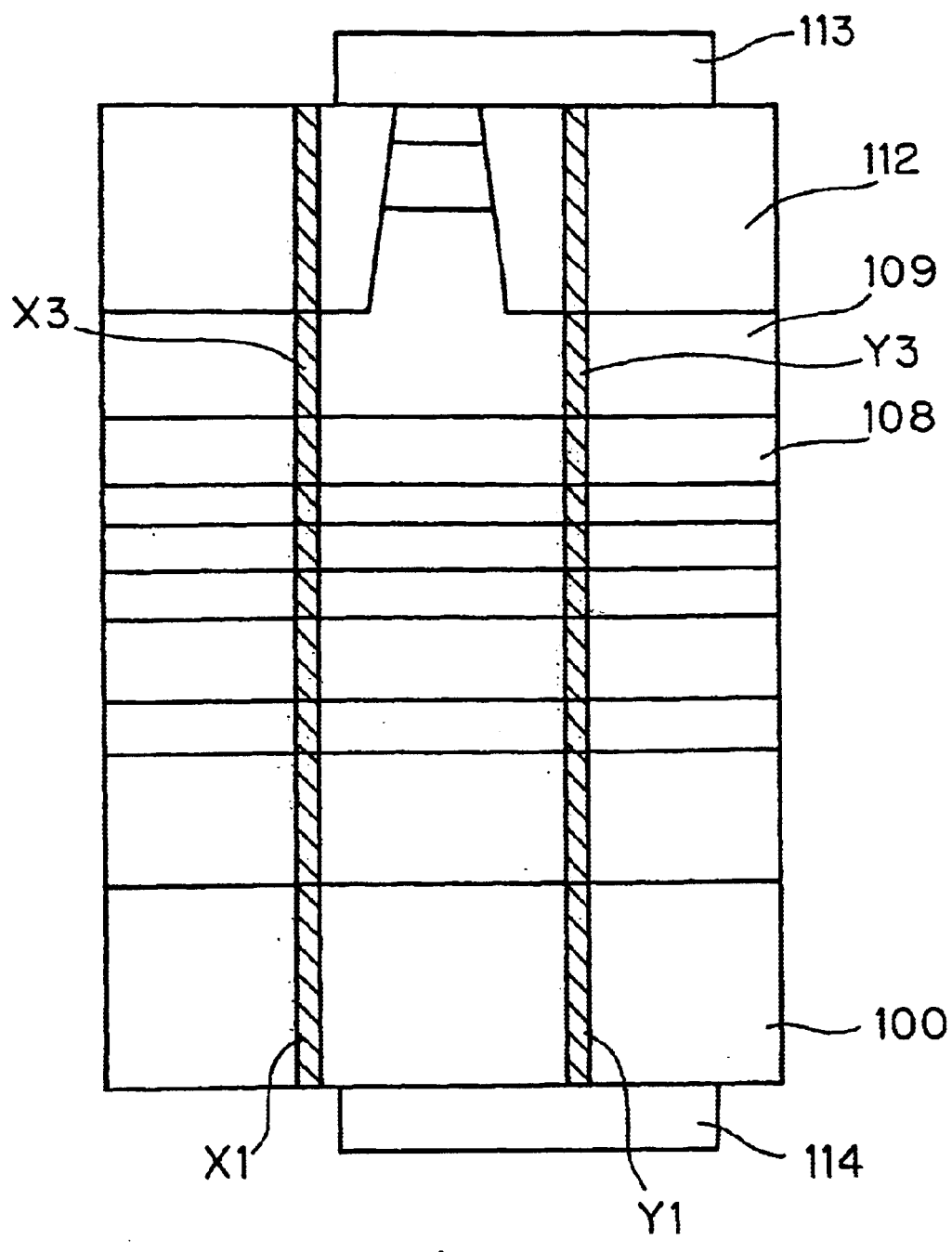
FIG. 3 is a vertical sectional view schematically showing the structure of the semiconductor laser device of the first embodiment.

FIG. 3 is a vertical sectional view schematically showing the structure of the semiconductor laser device 1 of a first embodiment of the invention, and FIGS. 1 and 2 are vertical sectional views schematically showing its layer structure as observed in the middle of its fabrication. In all these figures, the dislocation-concentrated region X1 and the high-luminescence region Y1 of the substrate are also shown.

The semiconductor laser device 1 was produced in the following manner. First, on an n-type GaN substrate 100 produced as described above, a layered structure 101 was formed (FIG. 1) by forming, through successive crystal growth by MOCVD (metalorganic chemical vapor deposition), a 3 μm n-type GaN layer 102, a 40 nm n-type $In_{0.07}Ga_{0.93}N$ crack prevention layer 103, a 1.2 μm n-type $Al_{0.01}Ga_{0.9}N$ clad layer 104, a 0.1 μm n-type GaN optical guide layer 105, a triple quantum well active layer 106 composed of 4 nm $In_{0.1}Ga_{0.9}N$ well layers and 8 nm $In_{0.01}Ga_{0.99}N$ barrier layers (in the order of a barrier layer, well layer, barrier layer, well layer, barrier layer, well layer, and barrier layer), a 20 nm p-type $Al_{0.3}Ga_{0.7}N$ carrier block layer 107, a 0.1 μm p-type GaN optical guide layer 108, a 0.5 μm p-type $Al_{0.1}Ga_{0.9}N$ clad layer 109, a 0.1 μm p-type GaN first contact layer 110, a 50 nm p-type $In_{0.15}Ga_{0.85}N$ second contact layer 111.

A sectional surface of this layered structure 101 of a group III nitride semiconductor was inspected under a transmissive electronic microscope, and it was found out that, inside the layered structure 101, there was a region where dislocations (defects) concentrated. This region with concentrated dislocations was located right above the dislocation-concentrated region X1 of the n-type GaN substrate 100, and extended from the bottom surface of the n-type GaN layer 102 to the top surface of the p-type InGaN second contact layer 111. Moreover, through fluorescence microscope inspection of the sectional surface of the layered structure 101, it was also found out that there was a region that, with more intense fluorescence than outside it, appeared somewhat yellowish and bright. This region with more intense fluorescence was located right above the high-luminescence region Y1 of the substrate 100, and extended from the bottom surface of the n-type GaN layer 102 to the top surface of the p-type InGaN second contact layer 111.

The region with concentrated dislocations and the region with more intense fluorescence inside the layered structure 101 are respectively contiguous with the dislocation-concentrated region X1 and the high-luminescence region Y1 of the substrate 100, and are therefore considered to result from the influence of the dislocation-concentrated region X1 and the high-luminescence region Y1. Hereinafter, the region with concentrated dislocations inside the layered structure 101 will be, like that inside the substrate 100, referred to as the "dislocation-concentrated region" and represented by X3, and the region with more intense fluorescence inside the layered structure 101 will be, like that inside the substrate 100, referred to as the "high-luminescence region" and represented by Y3.

Where there is a dislocation-concentrated region X3, if no attention is paid to its location when a laser optical waveguide region is formed, the former may physically interfere with the latter. Quite naturally, the laser optical waveguide region so formed offers unsatisfactory characteristic. Moreover, current more readily flows through the dislocation-concentrated regions X3 and X1, and therefore, if an electrode makes contact with an exposed portion of the defect-concentrated region X3 or X1, the operation current unduly increases. Furthermore, if the electrode formed on top of the layered structure 101 makes contact with an exposed portion of the dislocation-concentrated region X3, the metal of which the electrode is made more readily diffuses through the dislocation-concentrated region X3 into the layered structure 101, causing changes in the characteristics of the individual layers constituting the layered structure 101. This is highly likely to be the reason that, in some conventional semiconductor laser devices produced by laying a group III nitride semiconductor on a GaN substrate, their operation current gradually increases or their characteristics rapidly deteriorate.

To avoid this, in the semiconductor laser device 1 of this embodiment, as will be described below, a laser optical waveguide region is formed away from the dislocation-concentrated region X3, and electrodes are also formed away from the dislocation-concentrated regions X3 and X1. The high-luminescence region Y3, too, has different characteristics than elsewhere, and is therefore unsuitable for the formation of a laser optical waveguide region. Thus, the laser optical waveguide region is formed also away from the high-luminescence region Y3.

It is to be noted that the dislocation-concentrated region X3 and the high-luminescence region Y3 are not always present inside the layered structure 101. As will be described later, when semiconductor laser devices on a wafer are separated into individual chips, they may be cleaved apart in such a way that no dislocation-concentrated region X3 or high-luminescence region Y3 is present inside the chips. Here, however, for the purpose of explanation, they are assumed to be present and are shown in FIGS. 1 to 3.

After the formation of the layered structure 101 shown in FIG. 1, as shown in FIG. 2, along and right above the centerline between every pair of a dislocation-concentrated region X1 and a high-luminescence region Y1, a ridge-formed structure was formed periodically. A portion located right below this ridge-formed structure corresponds to the laser optical waveguide region. The ridge-formed structure is formed by digging the top surface of the p-type second contact layer 111 down to the middle of the p-type clad layer 109 by dry etching, and then re-growing an $Al_{0.1}Ga_{0.9}N$ layer 112 to fill the resulting depressions. Hereinafter, the $Al_{0.1}Ga_{0.9}N$ layer 112 so grown will be referred to as the embedded layer. The $Al_{0.1}Ga_{0.9}N$ embedded layer 112 may be of n- or i-type.

Thereafter, by lift-off or etching, a p-type electrode 113 and an n-type electrode 114 were formed. Here, as shown in FIG. 3, the electrodes 113 and 114 were so formed as to be located away from right above or below the dislocation-concentrated region X1 of the substrate 100.

In the semiconductor laser device 1 produced in this way, the laser optical waveguide region lies right between the dislocation-concentrated region X3 and the high-luminescence region Y3 of the layered structure 101, and thus offers excellent characteristics. Even if the dislocation-concentrated region X3 of the layered structure 101 reaches the top surface of the embedded layer 112 and is exposed, the p-type electrode 113 does not make contact with it. Thus, no current flows between the electrode 113 and the dislocation-concentrated region X3, and the diffusion into the layered structure 101 of the metal of which the electrode 113 is made is suppressed. Even though the dislocation-concentrated region X1 is exposed on the bottom surface of the substrate 100, the n-type electrode 114 does not make contact with it. Thus, no current flows between the electrode 114 and the dislocation-concentrated region X1. Consequently, in the semiconductor laser device 1, its operation current is less likely to increase, and accordingly its laser optical waveguide region is less likely to deteriorate. This helps achieve stable operation characteristics and a long laser oscillation life.

In the fabrication of the semiconductor laser device 1, the locations of the laser optical waveguide region and the electrodes 113 and 114 are determined relative to, not the dislocation-concentrated region X3 or high-luminescence region Y3 of the layered structure 101 itself, but the dislocation-concentrated region X1 and the high-luminescence region Y1 of the substrate 100. Since the dislocation-concentrated region X3 and the high-luminescence region Y3 of the layered structure 101 are respectively located right above the dislocation-concentrated region X1 and the high-luminescence region Y1 of the n-type GaN substrate 100, determining the locations of the laser optical waveguide region and the electrodes 113 and 114 as described above results in placing them in the desired locations. The locations of the dislocation-concentrated region X1 and the high-luminescence region Y1 of the n-type GaN substrate 100 are known from where the $SiO_2$ mask is located when the substrate 100 is produced.

It is also possible to determine the locations of the laser optical waveguide region and the electrodes 113 and 114 directly relative to the locations of the dislocation-concentrated region X3 and the high-luminescence region Y3 of the layered structure 101 as observed beforehand through inspection using a microscope or by another means. It is, however, more efficient to do that relative to the dislocation-concentrated region X1 and the high-luminescence region Y1 of the substrate 100. Where there is no dislocation-concentrated region X3 or high-luminescence region Y3, it is senseless to determine the locations of the laser optical waveguide region and the electrodes 113 and 114 in the manner described above. Even then, just in case there is any, it is advisable to always place the laser optical waveguide region and the electrodes 113 and 114 away from right above or below the dislocation-concentrated region X1 and the high-luminescence region Y1 of the substrate 100.

The electrodes 113 and 114 may be formed by etching. In that case, first a p-type or n-type electrode is formed all over the top surface of the embedded layer 112 or the bottom surface of the n-type GaN substrate 10, respectively, and then a predetermined portion thereof is removed by etching. Thus, the dislocation-concentrated regions X3 and X1 are temporarily covered by metal electrodes. Even then, the diffusion, mentioned earlier, of the electrode metal through the dislocation-concentrated region X3 into the semiconductor layer occurs mainly when the device is energized after the completion of its structure, and therefore covering the dislocation-concentrated region X3 with a metal temporarily in the electrode formation process does not unduly degrade the device characteristics.

Moreover, as will be understood from FIG. 3, the semiconductor laser device 1 is so structured that the dislocation-concentrated region X3 is located outside a portion of the device surrounding the ridge-formed structure, i.e. the most important portion thereof Accordingly, when semiconductor laser devices on a wafer are separated into individual chips, it is advisable to cleave it along dislocation-concentrated regions X3. Since the dislocation-concentrated region X3 is mechanically weaker than elsewhere, even a group III nitride semiconductor, which is considerably hard, can be cleaved easily along it. The portions of the dislocation-concentrated region X3 exposed on the end surface formed by cleaving can be removed by wet etching or grounding. This helps prevent leak current from flowing through an edge portion of the chip, and is therefore highly effective in enhancing the device characteristics. Alternatively, the wafer may be cleaved along lines between the ridge-formed structures and the dislocation-concentrated regions X3 so that the dislocation-concentrated regions X3 themselves are excluded from the chips. This helps prevent leak current from flowing through the dislocation-concentrated region X3.

Second Embodiment

Figure 4:
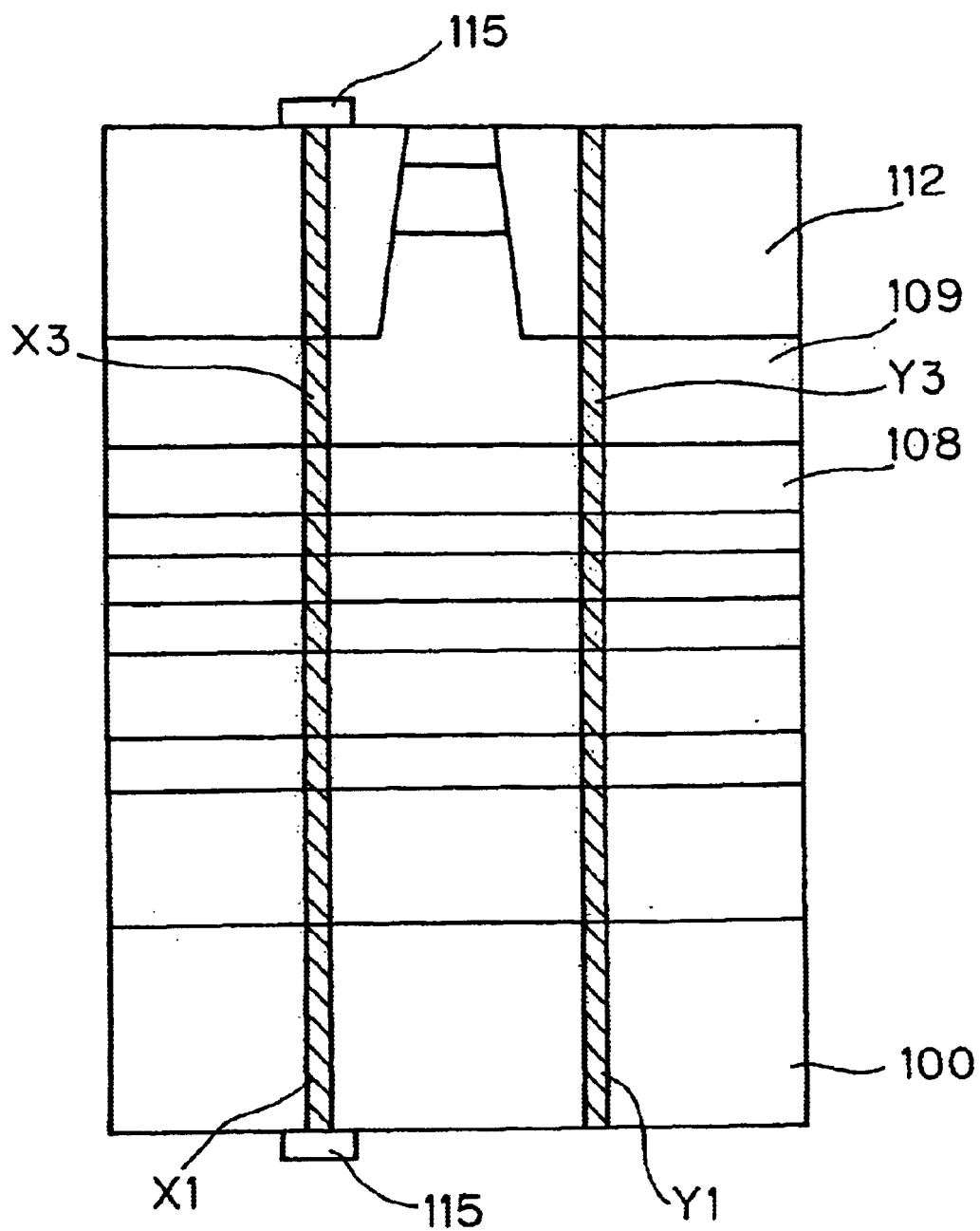
FIG. 4 is a vertical sectional view schematically showing the layer structure of the semiconductor laser device of a second embodiment, as observed in the middle of its fabrication.
Figure 5:
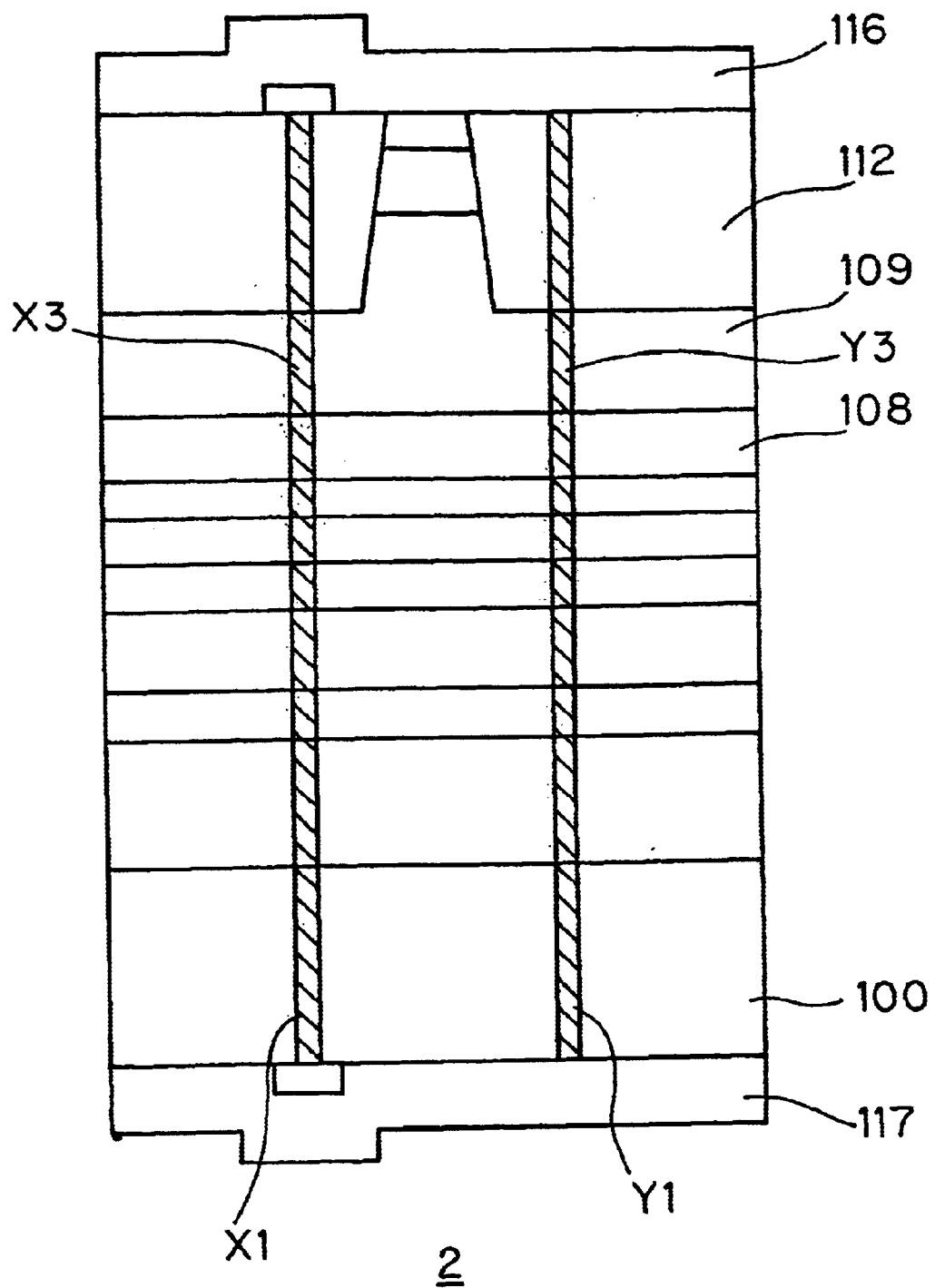
FIG. 5 is a vertical sectional view schematically showing the structure of the semiconductor laser device of the second embodiment.

FIG. 5 is a vertical sectional view schematically showing the structure of the semiconductor laser device 2 of a second embodiment of the invention, and FIG. 4 is a vertical sectional view schematically showing its layer structure in the middle of its fabrication. The semiconductor laser device 2 of this embodiment is a modified version of the semiconductor laser device 1 of the first embodiment in which dielectric films 115 are additionally formed, one in a portion of the top surface of the embedded layer 112 located right above the dislocation-concentrated region X1 of the n-type GaN substrate 100 and another in a portion of the bottom surface of the substrate 100 located right below the dislocation-concentrated region X1. The n-type GaN substrate 100 and the layered structure 101 are structured and produced in the same manner as in the first embodiment, and therefore overlapping explanations will not be repeated.

The dielectric films 115 were, after the formation of the ridge structure as shown in FIG. 2, formed by photolithography and lift-off using $SiO_2$ (FIG. 4). The dielectric films 115 were 50 μm wide and 250 nm thick. The width of the dislocation-concentrated region X3 produced inside the layered structure 101 was substantially equal to the width of the dislocation-concentrated region X1 inside the substrate 100, specifically 5 to 40 μm. The dielectric film 115 on the top surface of the embedded layer 112 covers the entire portion of the dislocation-concentrated region X3 exposed on that surface, and the dielectric film 115 on the bottom surface of the substrate 100 covers the entire portion of the dislocation-concentrated region X1 exposed on that surface.

After the formation of the dielectric films 115, a p-type electrode 116 was formed all over the top surfaces of the dielectric films 115, the ridge-formed p-type second contact layer 111, and the embedded layer 112, and an n-type electrode 117 was formed all over the bottom surface of the n-type GaN substrate 100 (FIG. 5).

The dielectric films 115 keep the electrodes 116 and 117 away from the dislocation-concentrated regions X3 and X1. Thus, no current flows between the p-type electrode 116 and the dislocation-concentrated region X3 or between the n-type electrode 117 and the dislocation-concentrated region X1. Nor does the metal of which the p-type electrode 116 is made diffuse through the dislocation-concentrated region X3 into the layered structure 101. Accordingly, the semiconductor laser device 2, too, offers stable operation characteristics and a long laser oscillation life.

The dielectric films 115 may be made of any other material than $SiO_2$, for example, SiN, SiO, ZnO, PbO, $TiO_2$, $ZrO_2$, $CeO_2$, $HfO_2$, $Al_2O_3$, $Bi_2O_3$, $Cr_2O_3$, $In_2O_3$, $Nd_2O_3$, $Sb_2O_3$, $Ta_2O_5$, $Y_2O_3$, $AlF_3$, $BaF_2$, $CeF_2$, $CaF_2$, $MgF_2$, $NdF_3$, $PbF_2$, $SrF_2$, ZnS, or ZnSe, or a mixture of any of these.

The dielectric films 115 may be so formed as to have a thickness of 1 nm to 1 μm, further preferably 5 nm to 500 nm. A film thickness smaller than 1 nm is undesirable, because it leads to unsatisfactory shielding of current and unsatisfactory suppression of metal diffusion, and even causes an electrical breakdown on application of a voltage. A film thickness greater than 1 μm is also undesirable, because it leads to increased stress inside the dielectric films, causing cracking and exfoliation in them.

The dielectric films 115 are so formed as to be wide enough to completely cover the exposed portions of the dislocation-concentrated region X3 and the dislocation-concentrated region X1. Thus, there is a lower limit but no particular upper limit to the their width. However, if the dielectric films 115 are extremely wide, they may hamper the flow of current to be fed to the laser optical waveguide region. To avoid this, restrictions are imposed on where to place the laser optical waveguide region. Therefore, in practical terms, it is preferable that the dielectric films 115 be 5 to 300 μm wide.

Third Embodiment

Figure 6:
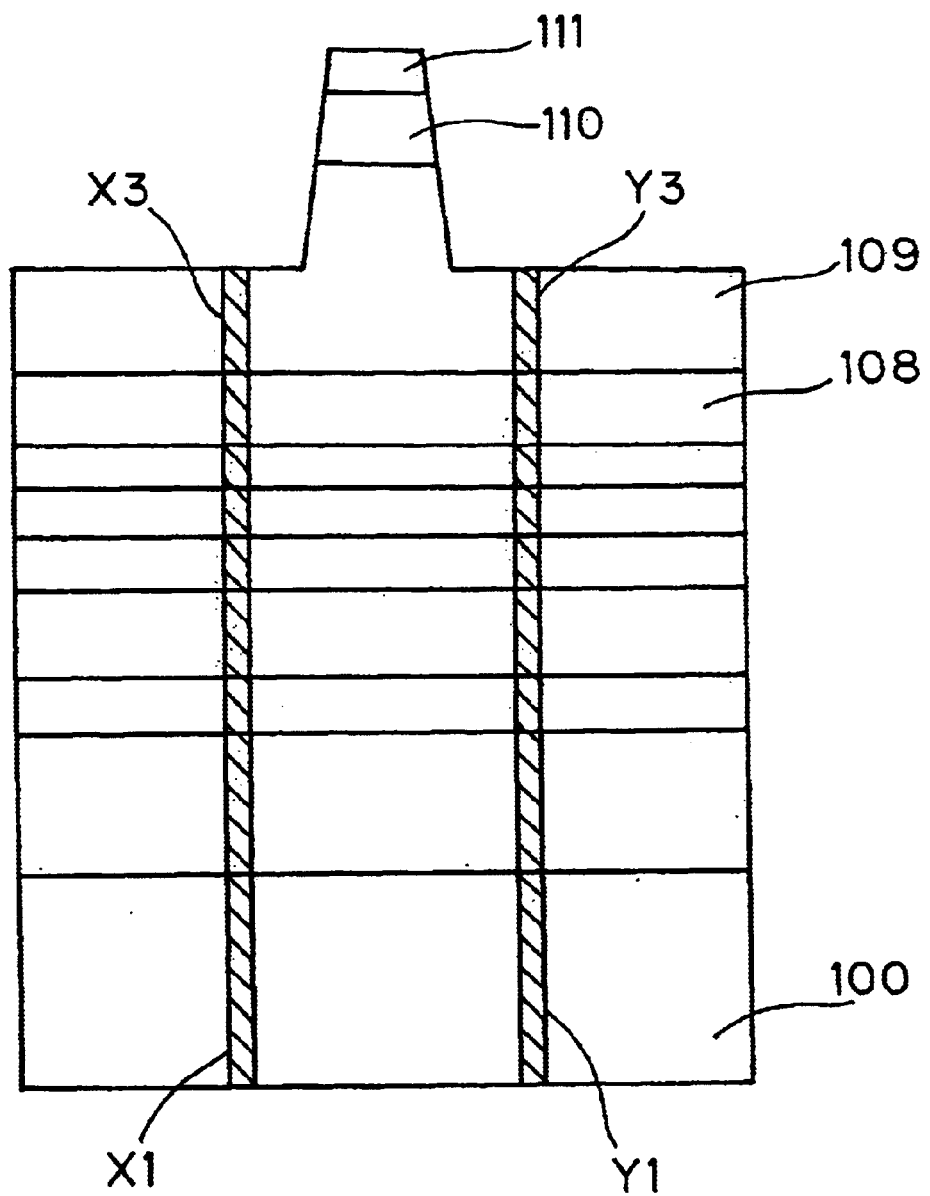
FIG. 6 is a vertical sectional view schematically showing the layer structure of the semiconductor laser device of a third embodiment, as observed in the middle of its fabrication.
Figure 7:
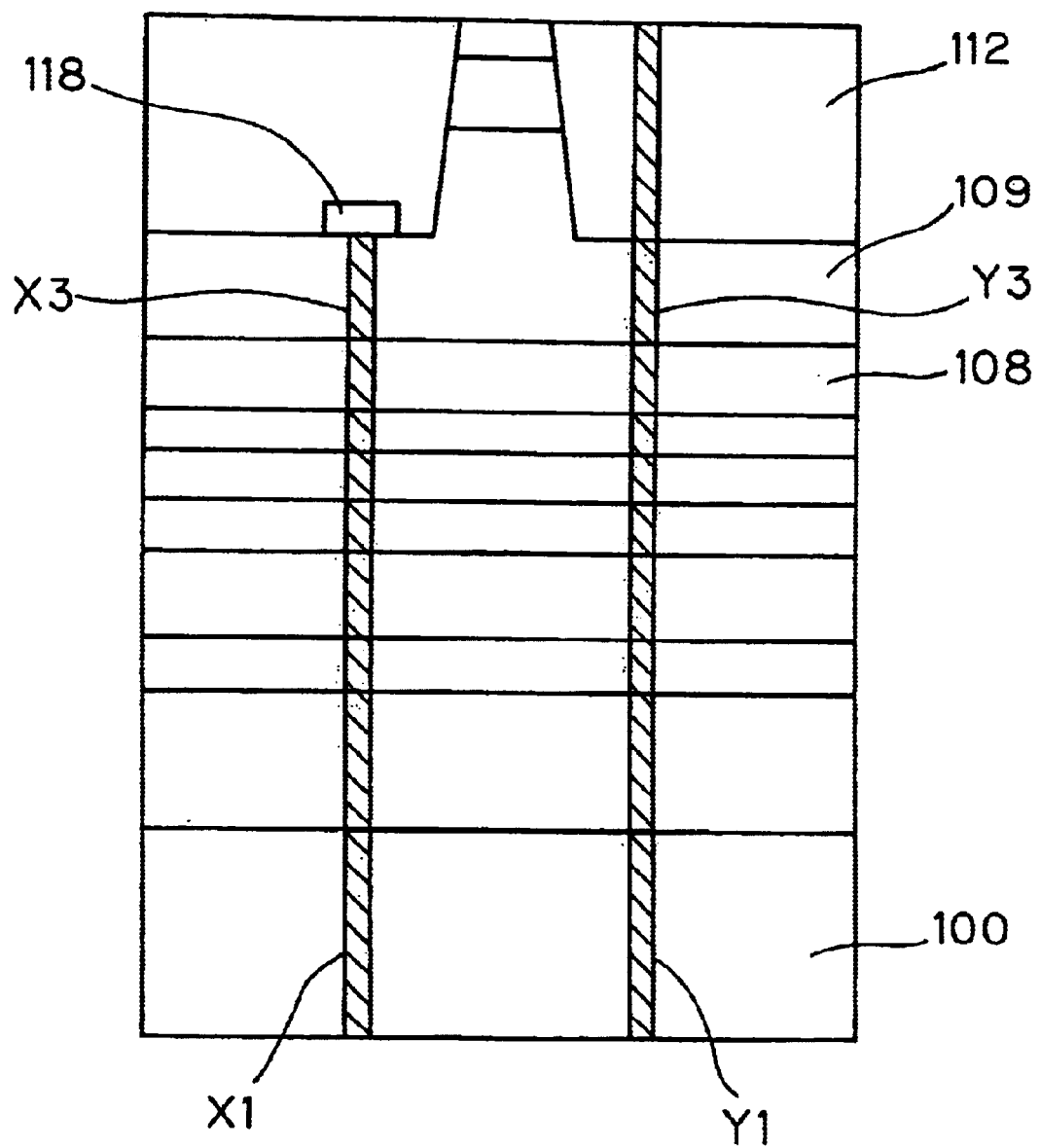
FIG. 7 is a vertical sectional view schematically showing the layer structure of the semiconductor laser device of the third embodiment, as observed in the middle of its fabrication.
Figure 8:
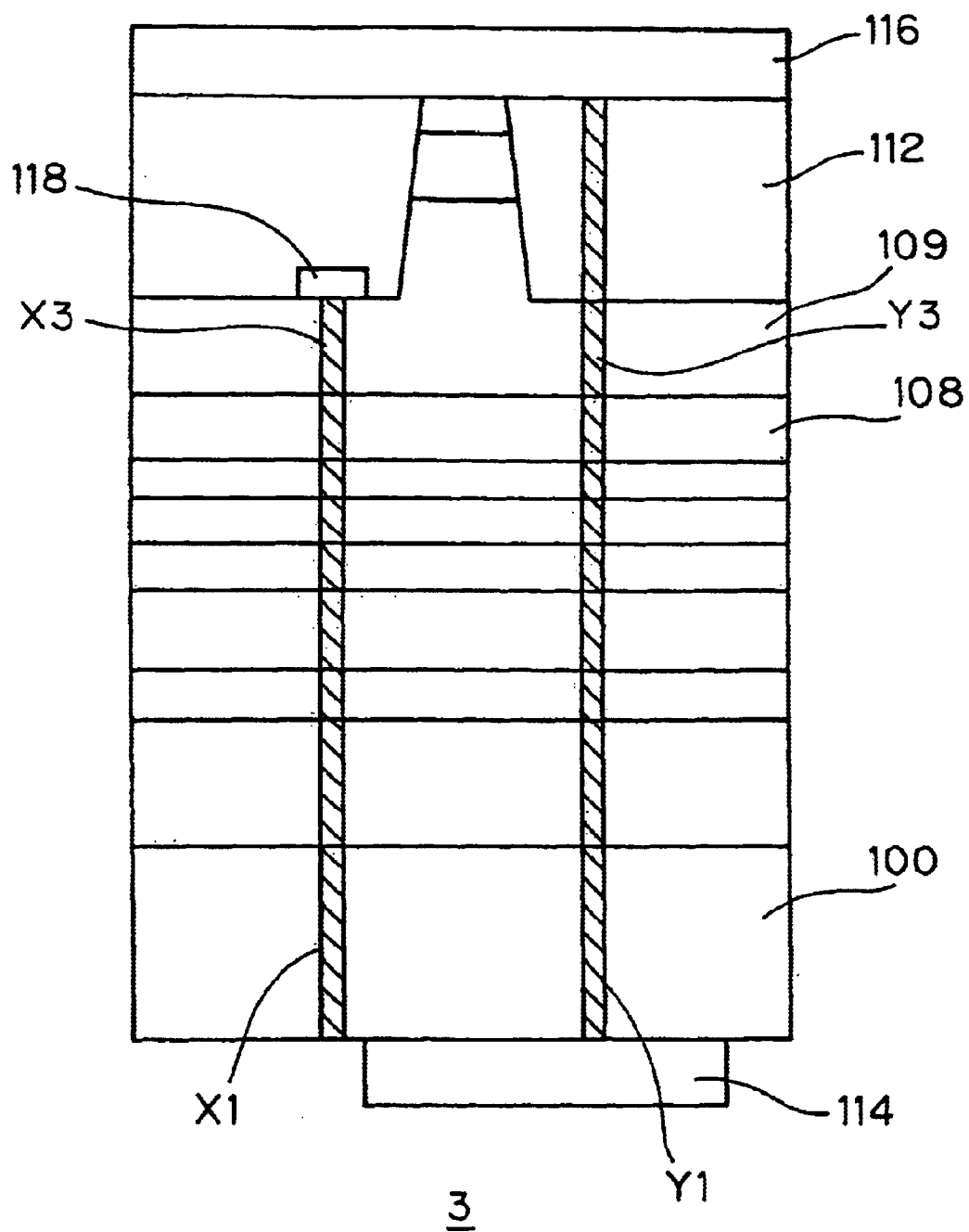
FIG. 8 is a vertical sectional view schematically showing the structure of the semiconductor laser device of the third embodiment.

FIG. 8 is a vertical sectional view schematically showing the structure of the semiconductor laser device 3 of a third embodiment of the invention, and FIGS. 6 and 7 are vertical sectional views schematically showing its layer structure in the middle of its fabrication. The semiconductor laser device 3 of this embodiment is a modified version of the semiconductor laser device 1 of the first embodiment in which a dielectric film 118 is additionally formed inside the layered structure 101, in a portion thereof located right above the dislocation-concentrated region X1 of the n-type GaN substrate 100. In other respects, the n-type GaN substrate 100 is structured in the same manner as in the first embodiment.

The dielectric film 118 was formed in the middle of the formation of the ridge-formed structure. Specifically, after digging, as described earlier, the top surface of the p-type second contact layer 111 down to the middle of the p-type clad layer 109 by dry etching to expose the p-type $Al_{0.1}Ga_{0.9}N$ layer 109 (FIG. 6), a $SiO_2$ film 118 is formed right above the dislocation-concentrated region X1 of the substrate 100, and then the $Al_{0.1}Ga_{0.9}N$ embedded layer 112 is re-grown to fill around the ridge-formed structure (FIG. 7).

After the formation of the dielectric film 118 and the ridge-formed structure, a p-type electrode 116 was formed all over the top surfaces of the ridge-formed p-type second contact layer 111 and the embedded layer 112, and an n-type electrode 114 was formed in a portion of the bottom surface of the n-type GaN substrate 100 elsewhere than right below the dislocation-concentrated region X1 (FIG. 8).

The presence of the dielectric film 118 prevents the dislocation-concentrated region X3 from affecting the epitaxial growth of the AlGaN embedded layer 112, and thus no dislocation-concentrated region is produced in the embedded layer 112. This reduces the leak current that flows elsewhere than through the laser optical waveguide region, and suppresses the diffusion into the layered structure 101 of the metal of which the p-type electrode 116 is made. Accordingly, the semiconductor laser device 3, too, offers stable operation characteristics and a long laser oscillation life.

Here, the dielectric film 118 is formed at the etched bottom of the ridge-formed structure, but it may be formed at another interface. For example, it may be formed at the interface between the n-type InGaN clack prevention layer 103 and the n-type AlGaN clad layer 104. However, it is preferable to form the dielectric film 118 at the etched bottom of the ridge-formed structure as in this embodiment, because then the semiconductor layer needs to be re-grown only once, and thus a better crystal is obtained in the semiconductor laser device, and also because the diffusion of the metal of which the electrode is made is less likely to reach the laser optical waveguide region. The dielectric film 118 is made of the same material and has the same thickness and width as those used in the second embodiment.

Fourth Embodiment

Figure 9:
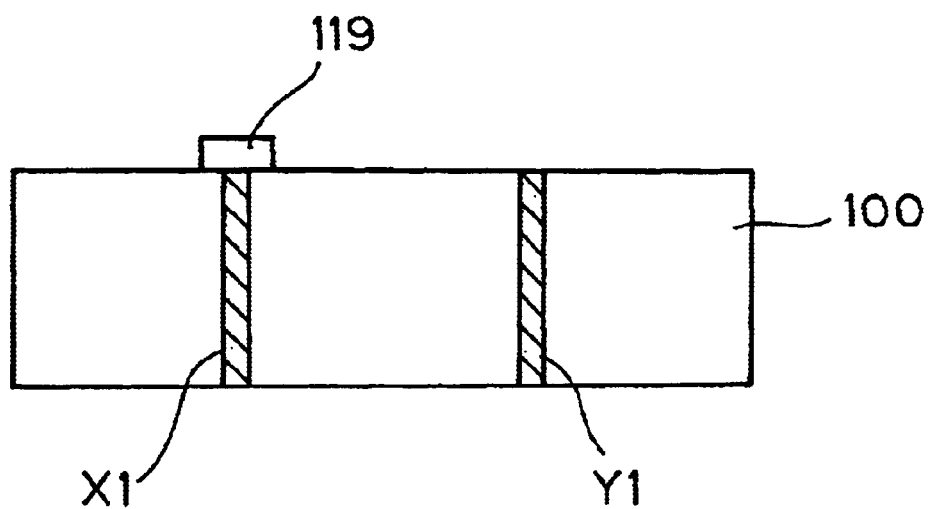
FIG. 9 is a vertical sectional view schematically showing the layer structure of the semiconductor laser device of a fourth embodiment, as observed in the middle of its fabrication.
Figure 10:
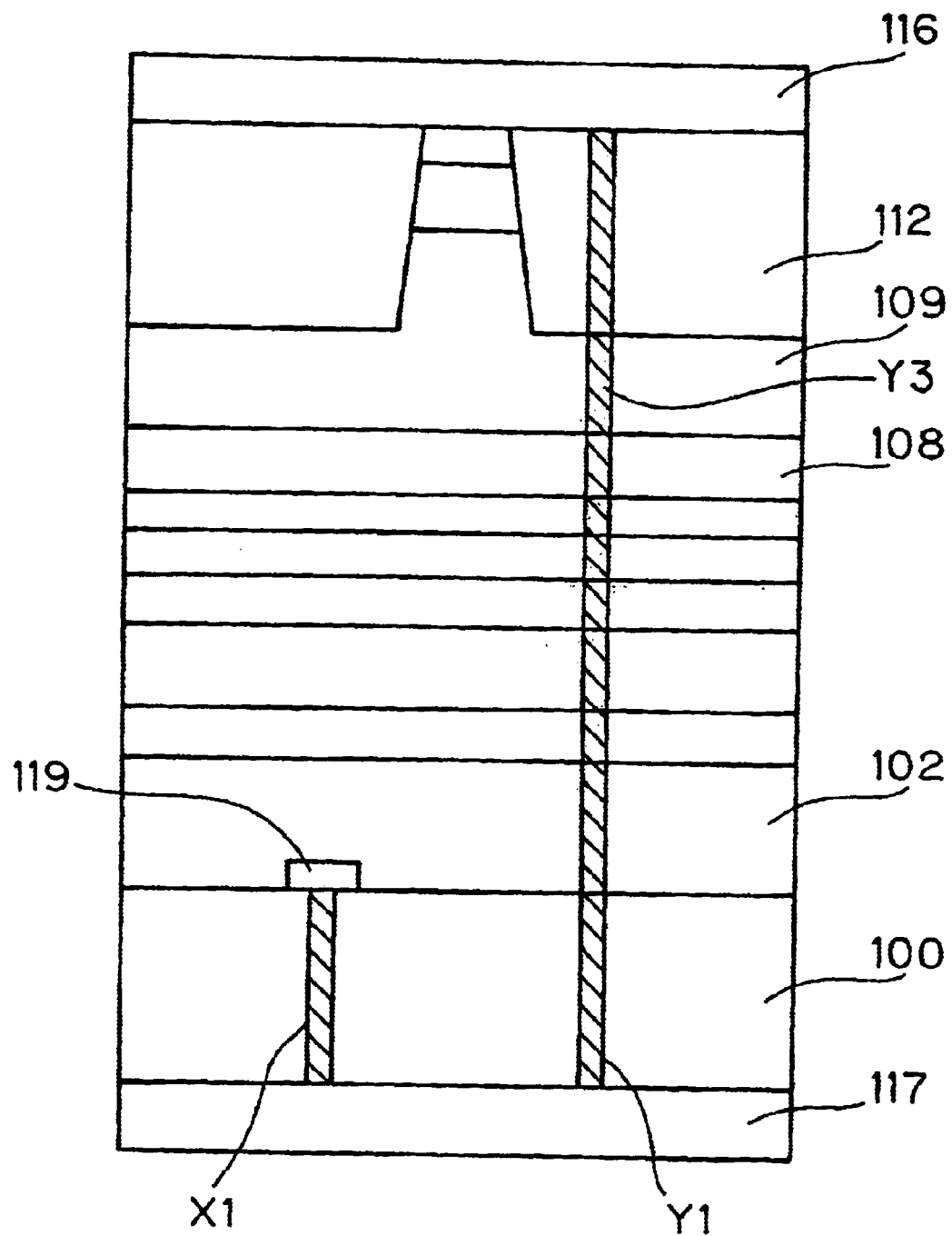
FIG. 10 is a vertical sectional view schematically showing the structure of the semiconductor laser device of the fourth embodiment.

FIG. 10 is a vertical sectional view schematically showing the structure of the semiconductor laser device 4 of a fourth embodiment of the invention, and FIG. 9 is a vertical sectional view schematically showing its layer structure in the middle of its fabrication. The semiconductor laser device 4 of this embodiment is a modified version of the semiconductor laser device 1 of the first embodiment in which a $SiO_2$ dielectric film 119 is formed in a portion of the top surface of the n-type GaN substrate 100 located right above the dislocation-concentrated region X1. The dielectric film 119 is formed on top of the substrate 100 before the layered structure 101 is formed (FIG. 9) The layered structure 101 is structured and produced in the same manner as in the first embodiment.

The presence of the dielectric film 119 on top of the substrate 100 slightly degrades the morphology of a portion of the n-type GaN layer 102 located above and around the dielectric film 119, but prevents the dislocation-concentrated region X1 of the substrate 100 from affecting the epitaxial growth of the GaN layer 102 and the individual layers formed above it, so that no dislocation-concentrated region is produced inside the layered structure 101. As a result, even if the p-type electrode 116 is formed all over the top surface of the layered structure 101 and the n-type electrode 117 is formed all over the bottom surface of the substrate 100, no leak current flows, and the metal of which the p-type electrode 116 is made is prevented from diffusing into the layered structure 101. Accordingly, the semiconductor laser device 4, too, offers stable operation characteristics and a long laser oscillation life. The dielectric film 119 is made of the same material and has the same thickness and width as those used in the second embodiment.

Fifth Embodiment

Figure 11:
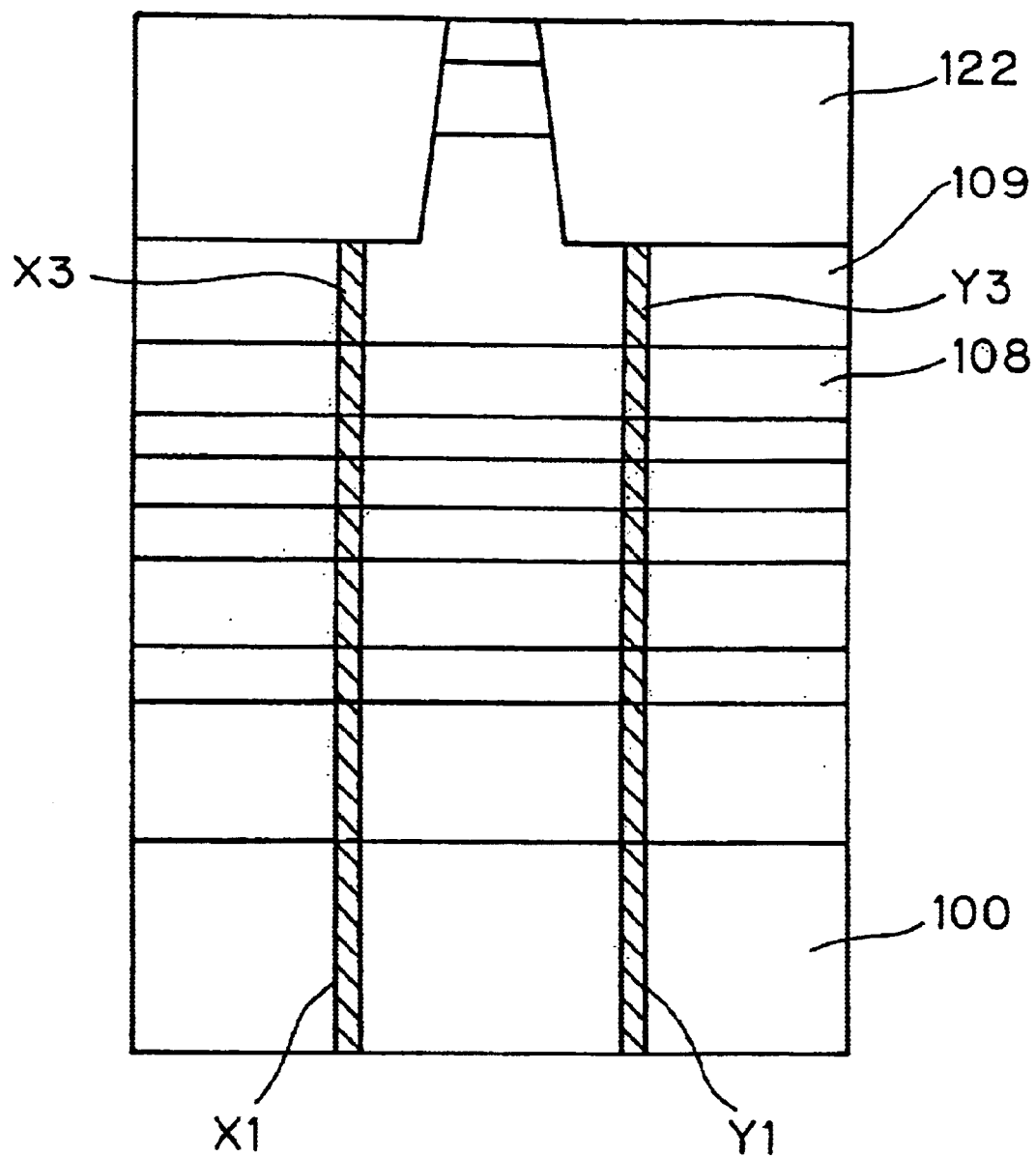
FIG. 11 is a vertical sectional view schematically showing the layer structure of the semiconductor laser device of a fifth embodiment, as observed in the middle of its fabrication.
Figure 12:
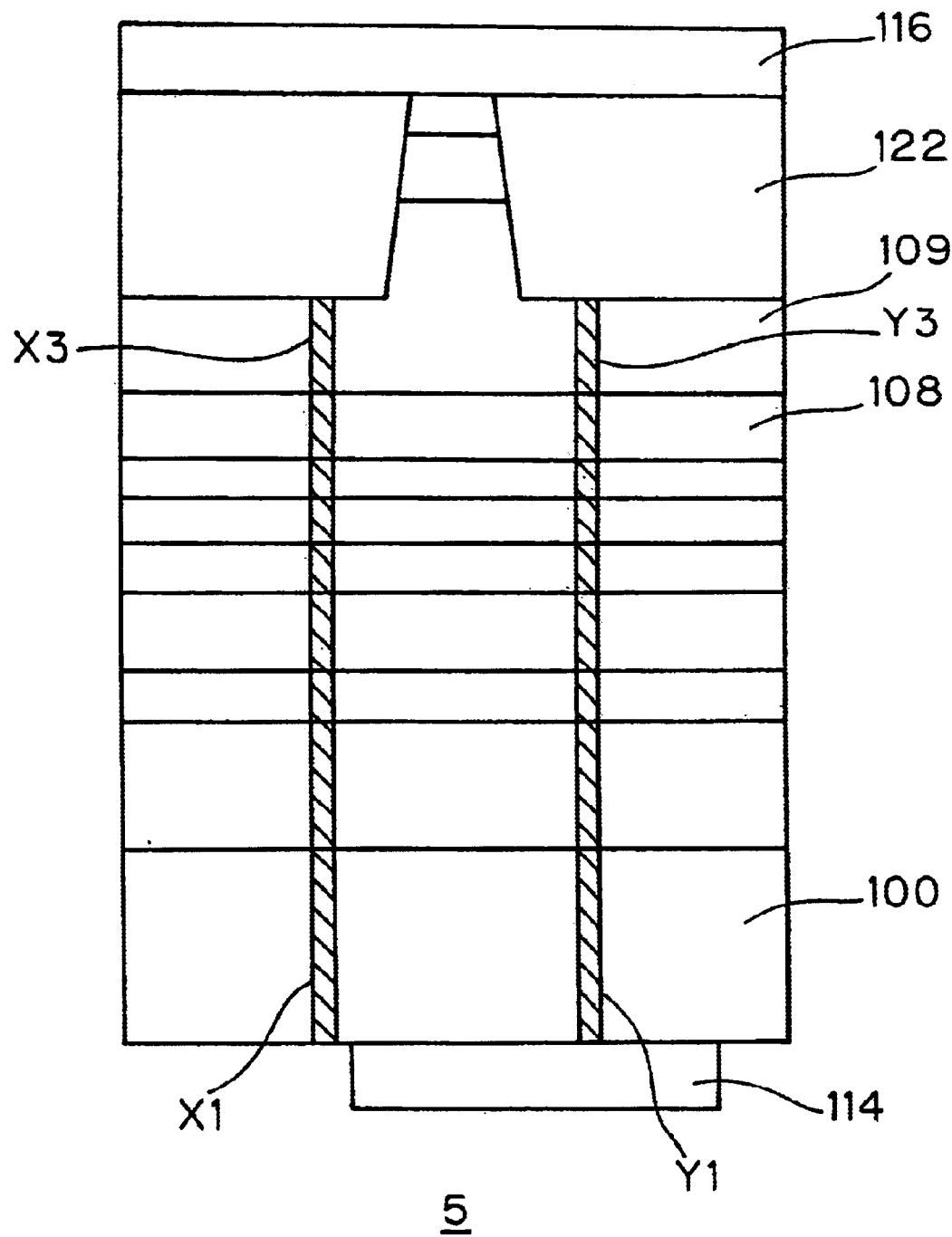
FIG. 12 is a vertical sectional view schematically showing the structure of the semiconductor laser device of the fifth embodiment.

FIG. 12 is a vertical sectional view schematically showing the structure of the semiconductor laser device 5 of a fifth embodiment of the invention, and FIG. 11 is a vertical sectional view schematically showing its layer structure in the middle of its fabrication. The semiconductor laser device 5 of this embodiment is a modified version of the semiconductor laser device 1 of the first embodiment in which, instead of AlGaN, a dielectric is used to fill around the ridge-formed structure, that is, an dielectric layer 122 is formed on top of the p-type AlGaN clad layer 109.

After the formation of the dielectric layer 122 (FIG. 11), a p-type electrode 116 was formed all over the top surface of the ridge-formed p-type second contact layer 111 and the dielectric layer 122, and an n-type electrode 114 was formed in a portion of the bottom surface of the n-type GaN substrate 100 elsewhere than right below the dislocation-concentrated region X1 (FIG. 12).

In the semiconductor laser device 5 of this embodiment, even if a dislocation-concentrated region X3 is produced inside the layered structure 101, it is shielded by the dielectric layer 122, and therefore it does not reach the p-type electrode 116. Accordingly, like the semiconductor laser devices 1 to 4, the semiconductor laser device 5 offers stable operation characteristics and a long laser oscillation life.

Example for Comparison

Figure 13:
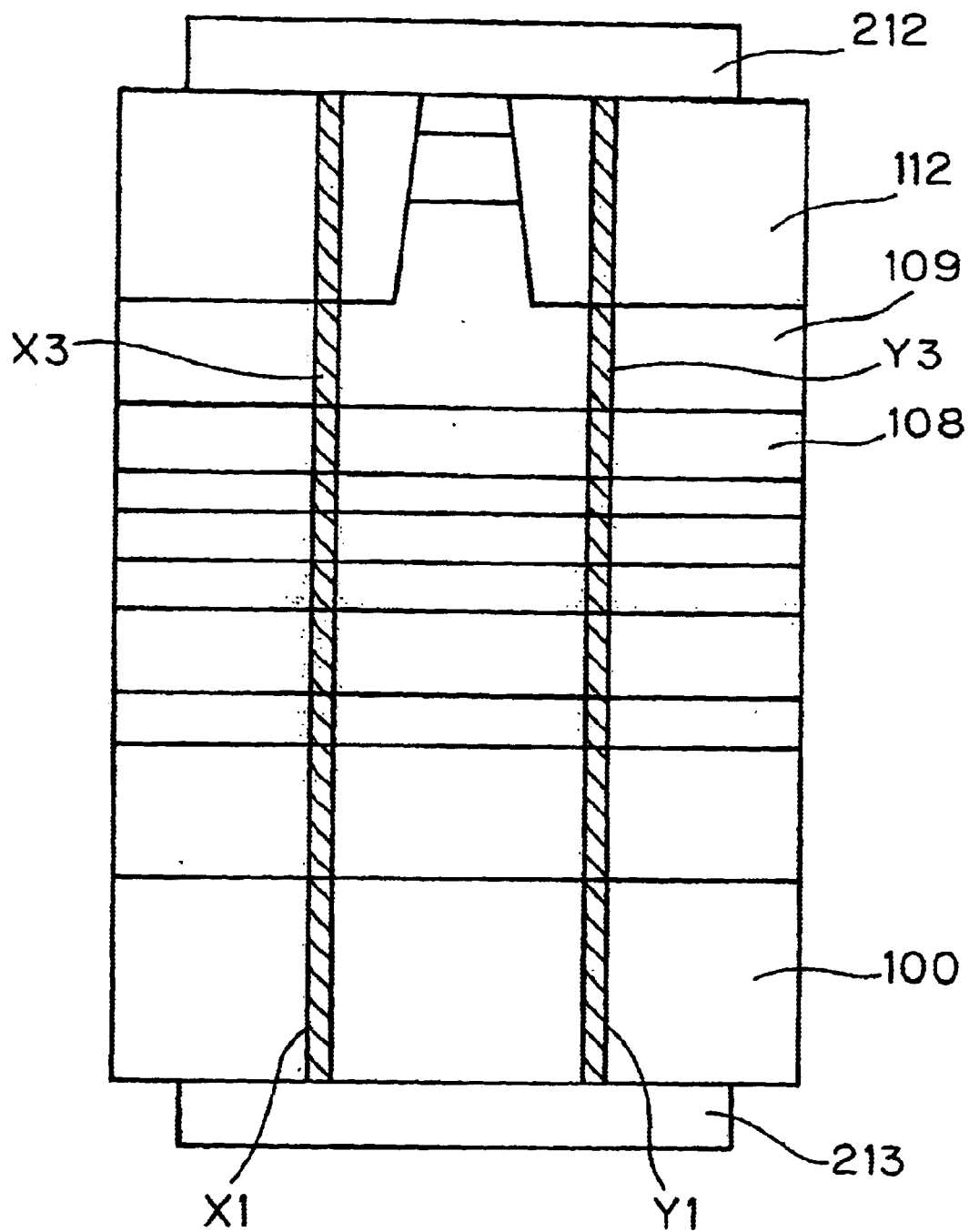
FIG. 13 is a vertical sectional view schematically showing the structure of a semiconductor laser device taken up as an example for comparison.

As an example for comparison, a semiconductor laser device 9 was fabricated by using the layer structure of the semiconductor laser device 1 of the first embodiment as observed in the middle of its fabrication shown in FIG. 2. FIG. 13 is a vertical sectional view schematically showing the structure of this semiconductor laser device 9. A p-type electrode 212 was formed on the top surface of the layered structure 101, over a wide area covering portions thereof right above the dislocation-concentrated region X1 and the high-luminescence region Y1 of the substrate 100, and an n-type electrode 213 was formed on the bottom surface of the substrate 100, over a wide area covering portions thereof right below the dislocation-concentrated region X1 and the high-luminescence region Y1 of the substrate 100.

Light-emission performance was evaluated with many samples of each of the semiconductor laser devices 1 to 5 of the embodiments of the invention and the semiconductor laser device 9 of the example for comparison. With the semiconductor laser device 9, under the conditions of 60° C. and 30 mW, some samples exhibited an increase in their operation current within 100 hours, and only half of all the samples had a laser oscillation life of 1,000 hours or longer. By contrast, with the semiconductor laser devices 1 to 5 of the embodiments, under the same conditions, no samples exhibited an increase in their operation current within 1,000 hours, and most samples had a laser oscillation life of 3,000 hours or longer. In this way, it was conformed that the presence of a dislocation-concentrated region in a group III nitride semiconductor substrate greatly influences the characteristics of a group III nitride semiconductor device, and that the structures of the embodiments are useful for the enhancement of the characteristics of a group III nitride semiconductor device.

The structures of the first to fifth embodiments described above need not be implemented strictly as they are described as separate embodiments, but the features of different embodiments may be freely combined together. For example, the first embodiment's feature of patterning a p-type electrode without forming a dielectric on a contact layer can be combined with the second embodiment's feature of forming a dielectric on the bottom surface of a substrate so that an n-type electrode is formed all over that surface.

In the first to fifth embodiments, the ridge-formed structure, and thus the laser optical waveguide region, is located right above the center line between the dislocation-concentrated region X1 and the high-luminescence region Y1. However, their location may be deviated on either side so long as the ridge-formed structure includes substantially no part of the dislocation-concentrated region X3 or high-luminescence region Y3. The current injection portion of the layered structure may have any other structure than a ridge-formed structure, for example an electrode stripe type structure or a BH type structure.

What matters in the first embodiment is the locations of the electrodes 113 and 114, and what matters in the second to fifth embodiments is the presence and locations of the dielectric layers 115, 118, 119, and 122. Therefore, the structure and composition of the other layers may be designed freely. For example, in all the embodiments, the p-type contact layer has a double layer structure, composed of a first and a second contact layer. However, this contact layer may be composed of a single layer. The electrodes may be made of any material so long as they are formed as ohmic electrodes that suit the group III nitride semiconductor. For example, the p-type electrode can be made of Au/Pd (with Pd on the semiconductor side), Au/Mo/Pd, Au/Pt/Pd, Au/Pt/Mo/Pd, Au/Ni, Au/Mo/Ni/Pd, or the like, and the n-type electrode can be made of Al/Hf, Al/Ti, Al/Hf/Ti, Al/Zr, or the like.

Obviously, many modifications and variations of the present invention are possible in light of the above teachings. It is therefore to be understood that within the scope of the appended claims, the invention may be practiced other than as specifically described.

What is claimed is:

1. A semiconductor laser device comprising a substrate of a group III nitride semiconductor, a layered structure of a group III nitride semiconductor formed on a top surface of the substrate, and an electrode formed on a top surface of the layered structure, wherein the substrate has a dislocation-concentrated region extending from a bottom surface to a top surface thereof and a low-dislocation region constituting a remaining portion thereof other than the dislocation-concentrated region, the layered structure has a stripe-shaped laser optical waveguide region located right above the low-dislocation region of the substrate, and the electrode is located right above the low-dislocation region of the substrate.

2. A semiconductor laser device comprising a substrate of a group III nitride semiconductor, a layered structure of a group III nitride semiconductor formed on a top surface of the substrate, and an electrode formed on a bottom surface of the substrate, wherein the substrate has a dislocation-concentrated region extending from a bottom surface to a top surface thereof and a low-dislocation region constituting a remaining portion thereof other than the dislocation-concentrated region, the layered structure has a stripe-shaped laser optical waveguide region located right above the low-dislocation region of the substrate, and the electrode is located right below the low-dislocation region of the substrate.

3. A semiconductor laser device comprising a substrate of a group III nitride semiconductor and a layered structure of a group III nitride semiconductor formed on a top surface of the substrate, wherein the substrate has a dislocation-concentrated region extending from a bottom surface to a top surface thereof and a low-dislocation region constituting a remaining portion thereof other than the dislocation-concentrated region, the layered structure has a stripe-shaped laser optical waveguide region located right above the low-dislocation region of the substrate, and current-shielding layers are formed, one in a portion of a bottom surface of the substrate located below the dislocation-concentrated region and another in a portion of a top surface of the layered structure located above the dislocation-concentrated region.

4. A semiconductor laser device comprising a substrate of a group III nitride semiconductor and a layered structure of a group III nitride semiconductor formed on a top surface of the substrate, wherein the substrate has a dislocation-concentrated region extending from a bottom surface to a top surface thereof and a low-dislocation region constituting a remaining portion thereof other than the dislocation-concentrated region, the layered structure has a stripe-shaped laser optical waveguide region located right above the low-dislocation region of the substrate, and a current-shielding layer is formed inside the layered structure in a portion thereof located above the dislocation-concentrated region of the substrate.

5. A semiconductor laser device as claimed in one of claims 1 to 4, wherein the dislocation-concentrated region, as seen from above, is shaped like a stripe substantially parallel to the laser optical waveguide region of the layered structure.

6. A semiconductor laser device as claimed in claim 3 or 4, wherein the current-shielding layer or current-shielding layers are made of a dielectric containing at least one of $SiO_2$, SiN, SiO, ZnO, PbO, $TiO_2$, $ZrO_2$, $CeO_2$, $HfO_2$, $Al_2O_3$, $Bi_2O_3$, $Cr_2O_3$, $In_2O_3$, $Nd_2O_3$, $Sb_2O_3$, $Ta_2O_5$, $Y_2O_3$, $AlF_3$, $BaF_2$, $CeF_2$, $CaF_2$, $MgF_2$, $NdF_3$, $PbF_2$, $SrF_2$, ZnS, and ZnSe.

7. A semiconductor laser device as claimed in claim 3 or 4, wherein the current-shielding layer or current-shielding layers have a thickness equal to or greater than 1 nm and smaller than or equal to 1 μm.

8. A semiconductor laser device as claimed in claim 3 or 4, wherein the current-shielding layer or current-shielding layers have a width equal to or greater than 5 μm and smaller than or equal to 300 μm.

* * * * *